United States Patent
Tsunoda et al.

(10) Patent No.: US 7,437,037 B2
(45) Date of Patent: Oct. 14, 2008

(54) OPTICAL MODULE HAVING GAIN MEMBER AND PARTIAL REFLECTION SECTION WAVEGUIDES FORMED ON A SUBSTRATE

(75) Inventors: Yukito Tsunoda, Kawasaki (JP); Satoshi Ide, Kawasaki (JP); Tsuyoshi Yamamoto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 2 days.

(21) Appl. No.: 11/392,646

(22) Filed: Mar. 30, 2006

(65) Prior Publication Data

US 2007/0172186 A1   Jul. 26, 2007

(30) Foreign Application Priority Data

Jan. 23, 2006  (JP)  ............... 2006-014329

(51) Int. Cl.
*G02B 6/26* (2006.01)
*G02B 6/42* (2006.01)

(52) U.S. Cl. .............. 385/39; 385/42; 385/47; 385/50

(58) Field of Classification Search .............. 385/39
See application file for complete search history.

(56) References Cited

U.S. PATENT DOCUMENTS 4,728,168 A * 3/1988 Alferness et al. .......... 385/41
5,023,885 A   6/1991 Auracher et al. .......... 372/92
6,335,819 B1 * 1/2002 Cho et al. ................. 359/333

FOREIGN PATENT DOCUMENTS

| JP | SHO64-25587 | 1/1989 |
| JP | HEI2-114691 | 4/1990 |
| JP | HEI5-045681 | 2/1993 |
| JP | 2000-77771 | 3/2000 |
| JP | 2003-508927 | 3/2003 |
| WO | WO 01/17077 | 3/2001 |

* cited by examiner

*Primary Examiner*—Frank G Font
*Assistant Examiner*—Mary A El Shammaa
(74) *Attorney, Agent, or Firm*—Hanify & King, P.C.

(57) ABSTRACT

The present invention is directed to an optical module, which stabilizes an oscillation characteristic of a laser by means of a simple configuration. To this end, a gain member, a partial reflection section connected to the gain member, and an optical device section connected to the partial reflection section are formed integrally into an apparatus of the present invention. The partial reflection section includes an optically-coupling waveguide section having a first light waveguide connected to the gain member, and a second light waveguide which has an optical axis differing from that of the first light waveguide and which is optically coupled to the first light waveguide and optically connected to the optical device section; and a first total reflection mirror formed at an end of the first light waveguide facing the optical device section.

15 Claims, 11 Drawing Sheets

OPTICAL MODULE HAVING GAIN MEMBER AND PARTIAL REFLECTION SECTION WAVEGUIDES FORMED ON A SUBSTRATE

BACKGROUND OF THE INVENTION

1) Field of the Invention

The present invention relates to an optical module, and more particularly, to an optical module suitable for use with an optical transmitter employed in an optical communications system.

2) Description of Related Art

An optical network has recently been used as a high-capacity transmission network. From the viewpoint of an increase in a transmission distance, an external modulation system, which modulates the intensity or phase of a CW (Continuous Wave) light source by means of an external modulator, has been widely known in the field of this optical network. With an aim of miniaturizing an optical transmitter, a transmitter module into which the function of the light source and that of the external modulator are integrated has been sought.

A wavelength multiplex technique for multiplexing a plurality of light beams of different wavelengths and transmitting the thus-multiplexed light beam through a single optical fiber is available as a technique for increasing the channel capacity of the optical network. However, if production variance exists in laser oscillation wavelength, difficulty will be encountered in obtaining a light source of desired wavelength. Further, the wavelength multiplexing technique entails a necessity for preparing light sources conforming to respective wavelengths used in wavelength multiplex optical communication.

As a result of diversification of specifications of the light sources having stable light emission wavelengths, there sometimes arises an inventory problem. For this reason, a light source—which enables variable adjustment of the wavelength of a laser to be oscillated—is sought. A laser light source of external oscillator type, which enables variation of the wavelength of laser oscillation by means of varying oscillation requirements, has been put forward as a wavelength-adjustable light source. An example laser light source of external oscillator type is shown in FIG. 10.

A laser light source 100 of external oscillator type shown in FIG. 10 comprises a gain member 101 having at one end an antireflective film 101a (an AR coating) and at the other end a partial reflection mirror 101b; and a total reflection mirror 102 disposed opposite the antireflective film 101a with a space interposed therebetween. By means of this configuration, light spontaneously emitted from the gain member 101 propagates along a two-way optical path between the partial reflection mirror 101b and the total reflection mirror 102, whereby a laser beam oscillation is induced.

Oscillation requirements for the two-way optical path are determined according to the distance between the partial reflection mirror 101b and the total reflection mirror 102. As mentioned above, a section of optical path between the total reflection mirror 102 and the partial reflection mirror 101b serves as a variable external oscillator 102A which enables variable provision of oscillation requirements. Specifically, the wavelength of light to be oscillated can be set by means of actuating the total reflection mirror 102 so as to set the distance between the total reflection mirror 102 and the partial reflection mirror 101b.

At the time of manufacture of the optical transmitter module adopting the above-described external modulation system, the practice of integrally manufacturing a wavelength-variable laser light source of external resonator type employed as a CW light source and an external modulator is not carried out. The optical transmitter module has hitherto been manufactured by a method of separately fabricating the laser light source and the external modulator and connecting them together through butt-joining. However, this manufacturing technique has encountered difficulty in aligning the light source with the external modulator, and involves a relatively heavy workload. Further, in the event of a loss caused by misalignment inducing a decrease in output, there will arise a problem of an individual difference arising in output intensity.

To solve the problem, an integrated laser light source of external type is described in Patent Document 1, which will be described below, as a configuration which does not need alignment operation during butt-joining and into which the wavelength-variable light source and the external modulator are integrated. As shown in, e.g., FIG. 11, the integrated external resonator laser light source described in Patent Document 1 is configured by means of integrating the wavelength-adjustable external resonator laser 100 and an external modulator 104.

Specifically, the integrated external resonator laser light source 110 is configured by means of arranging a partial reflector 103 and the external modulator 104 side by side in an optical path and integrally with the gain member 101 constituting the laser light source 100 of external resonator type analogous to that shown in FIG. 10. A reflector of etched facet type or a waveguide loop mirror is applied as the partial reflector 103 formed integrally with the gain member 101 and the external modulator 104. Reference numeral 105 designates a light waveguide which serves as a light propagation path penetrating through the gain member 101, the partial reflector 103, and the external modulator 104, all of which are formed integrally.

Techniques described in Patent Documents 2 to 5 are also available as known techniques relevant to the present invention. Patent Document 2 describes an integrated semiconductor laser where a gain region and a waveguide region of a mirror, which is optically coupled to one end face of a directional waveguide, are integrated on a semiconductor substrate. An external oscillator of a semiconductor laser described in Patent Document 3 has a directional coupling waveguide having a total reflection mirror at one waveguide end face thereof. Moreover, Patent Document 4 describes a technique of integrally forming a conductor light absorbing region and a variable light attenuation region. Patent Document 5 describes a wavelength selection element where a light reflection section is provided at either end of a directional coupling waveguide.

(Patent Document 1) JP-2003-508927A
(Patent Document 2) JP-SHO-64-25587A
(Patent Document 3) JP-HEI-2-114691A
(Patent Document 4) JP-2000-77771A
(Patent Document 5) JP-HEI-5-45681A However, as described in Patent Document 1, when a partial reflector of facet type is fabricated between a gain member and an external modulator by means of etching, the reflector assumes a complicated structure. The current device manufacturing technique encounters difficulty in manufacturing a partial reflectivity capable of acquiring sufficient reflectivity. There may also arise a case where limitations are imposed on a wavelength range where partial reflection is achieved or a case where multiple reflection arises because the reflector has a plurality of reflection faces. The multiple reflection may hinder an improvement in stability of operation of the resonator.

As described in Patent Document 1, when a partial reflector consisting of a waveguide loop mirror is provided, a waveguide having a gentle curve must be formed to form a waveguide for the loop area such that the loss of the waveguide is reduced with a view toward enhancing oscillation efficiency. Therefore, there also arises a problem of the module becoming bulky.

The techniques described in Patent Documents 2 to 5 do not describe the laser light source integrated with an external modulator which solves the above problem.

SUMMARY OF THE INVENTION

The present invention has been conceived in light of the drawbacks and aims at rendering a resonance characteristic of a laser stable by means of a simple configuration without involvement of an increase in the scale of a module into which an external resonator and an external modulator are integrated.

The present invention also aims at rendering the range of an oscillation wavelength stable.

To these ends, the present invention provides an optical module into which a gain member, a partial reflection section connected to the gain member, and an optical device section connected to the partial reflection section are formed integrally, wherein the partial reflection section comprises an optically-coupling waveguide section having a first light waveguide connected to the gain member and a second light waveguide which has an optical axis differing from that of the first light waveguide and which is optically coupled to the first light waveguide and optically connected to the optical device section; and a first total reflection mirror formed at an end of the first light waveguide facing the optical device section.

Preferably, the optically-coupling waveguide section can be formed as a directional-coupling waveguide section to which the first and second light waveguides are directionally coupled.

Moreover, the optically-coupling waveguide section may have a multimode interference waveguide for connecting together the first light waveguide and the second light waveguide.

Furthermore, the second light waveguide may be configured so as to include a curved light waveguide section.

In addition, the thicknesses of respective first light waveguide and the second light waveguide can be configured so as to become asymmetrical to each other.

Further, a light absorbing member may be formed at an end of the second light waveguide facing the gain member.

Preferably, the partial reflection section subjects a portion of light, which has entered the first light waveguide by way of the gain member, to total reflection on the first total reflection mirror, and outputs a remaining portion of the light to the optical device section byway of the second light waveguide.

The optical device is a light modulator, an optical attenuator, or an optical switch.

Moreover, the optical module may further comprise a second total reflection mirror which is disposed opposite the first total reflection mirror by way of the optically-coupling waveguide section and the gain member and which constitutes a laser oscillation section for oscillating laser with the cooperation of the first total reflection mirror and the gain member; and an oscillation condition setting section which variably sets oscillation conditions for oscillating laser.

The oscillation condition setting section can be formed from a distance setting mechanism which variably sets a distance between the second total reflection mirror and the gain member.

The oscillation condition setting section can be formed integrally on the gain member.

Consequently, according to the present invention, the partial reflection section comprises an optically-coupling waveguide section having a first light waveguide connected to the gain member, and a second light waveguide which has an optical axis differing from that of the first light waveguide and which is optically coupled to the first light waveguide and optically connected to the optical device section; and a first total reflection mirror formed at an end of the first light waveguide facing the optical device section. Accordingly, the present invention yields an advantage of the ability to render the band of an oscillation wavelength broad and to enhance the stability of an output laser beam while reducing the scale of the module.

DESCRIPTION OF THE PREFERRED EMBODIMENTS

Embodiments of the present invention will be described hereinbelow by reference to the drawings.

A disclosure of an embodiment, which is provided below, renders obvious another technical problem, means for solving the technical problem, and a working-effect of the means as well as the above-mentioned objects of the present invention.

[A1] Description of a First Embodiment

Figure 1:
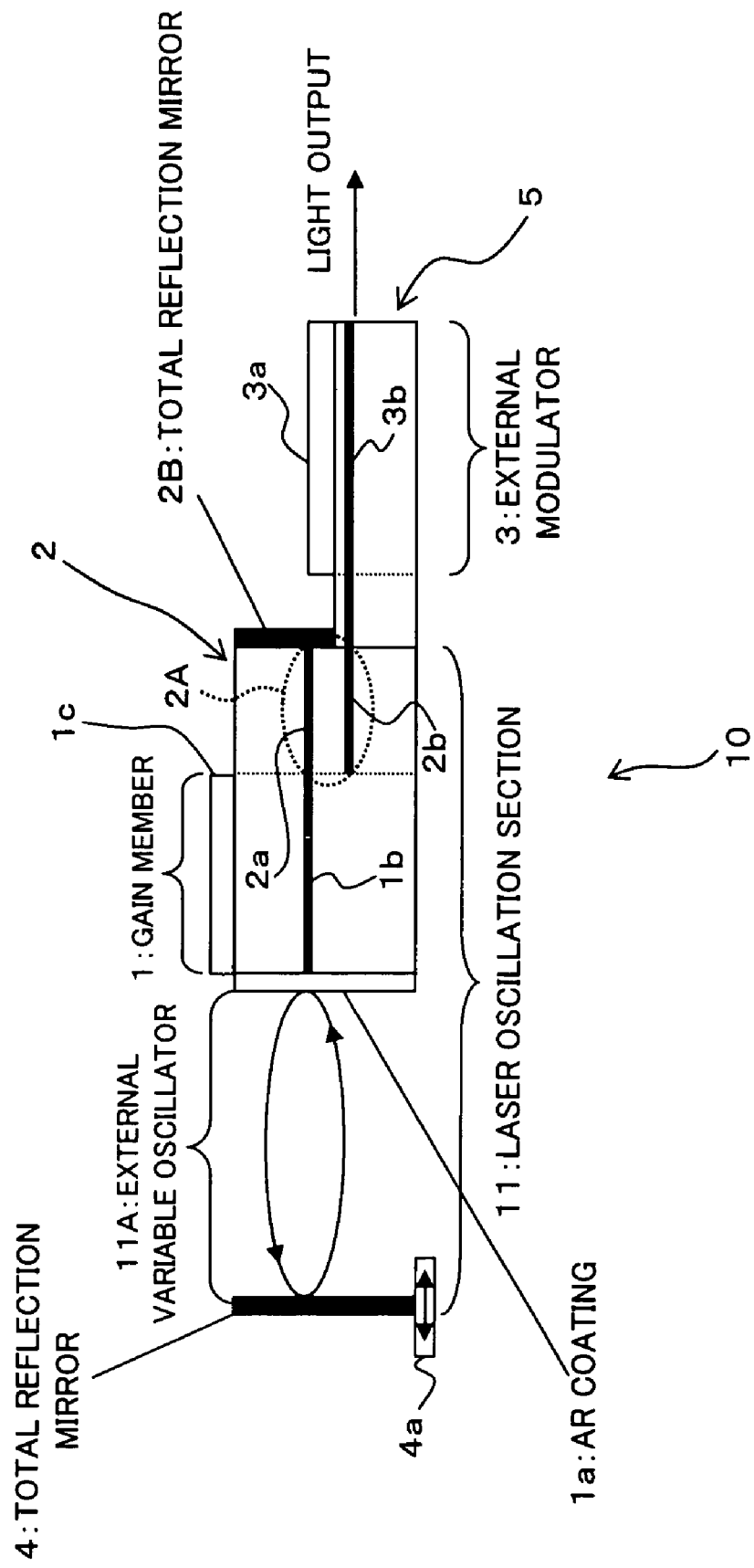
FIG. 1 is a diagrammatic illustration showing an optical module according to a first embodiment of the present invention.

FIG. 1 is a diagrammatic illustration showing an optical module according to a first embodiment of the present invention. An optical module 10 shown in FIG. 1 can be applied particularly as an optical transmitter module in an optical communications system. The optical module 10 has an optical sub-assembly 5 as an optical module where a gain member 1, a partial reflection section 2, and an external modulator (an optical device section) 3 are formed integrally on a substrate; and a total reflection mirror 4. In FIG. 1, reference numeral 1*b* designates an active layer forming the gain member 1, and reference numeral 1*c*designates a current injection electrode.

A laser oscillation section 11, which oscillates a laser beam at an oscillation wavelength determined by a distance between the partial reflection section 2 and the total reflection mirror 4, is formed from the gain member 1, the partial reflection section 2, and the total reflection mirror 4. Put another way, the total reflection mirror 4 is a second total reflection mirror. The second total reflection mirror is disposed opposite a first total reflection mirror 2B, which constitutes the partial reflection section 2 to be described later, with an optical-coupling waveguide section 2A and the gain member 1 sandwiched therebetween; and serves as a second total reflection mirror constituting the laser oscillation section 11 which causes laser light to oscillate by means of the first total reflection mirror 2B and the gain member 1.

A component of the laser beam oscillated by the laser oscillation section 11, which has passed through the partial reflection section 2, is guided to the external modulator 3, and the external modulator 3 subjects the guided component to required data modulation. Reference numeral 3*a* is an electrode for causing the external modulator 3 to effect data modulation.

Specifically, an antireflective film (AR coating) 1*a* is formed on an end face of the gain member 1 facing the total reflection mirror 4, and the total reflection mirror 4 is disposed opposite the antireflective film 1*a* with a required space therebetween. Thereby, the light spontaneously emitted from the gain member 1 propagates over a two-way optical path between the partial reflection section 2 and the total reflection mirror 4, to thus oscillate the laser beam.

At this time, oscillation requirements for the two-way optical path are given by means of variably setting the distance between the antireflective film 1*a* and the total reflection mirror 4 with a mirror mount 4*a*. As mentioned above, a section of the optical path between the total reflection mirror 4 and the antireflective film 1*a* serves as a variable external oscillator 11A capable of variably setting oscillation requirements. Specifically, the wavelength of light to be oscillated can be set by means of actuating the total reflection mirror 4 to thereby determine the distance between the total reflection mirror 4 and the antireflective film 1*a*.

The mirror mount 4*a*, which is a distance setting mechanism for actuating the total reflection mirror 4 to set a distance between the total reflection mirror 4 and the antireflective film 1*a*, constitutes an oscillation requirement setting section which variably sets oscillation requirements for laser oscillation.

Figure 11:
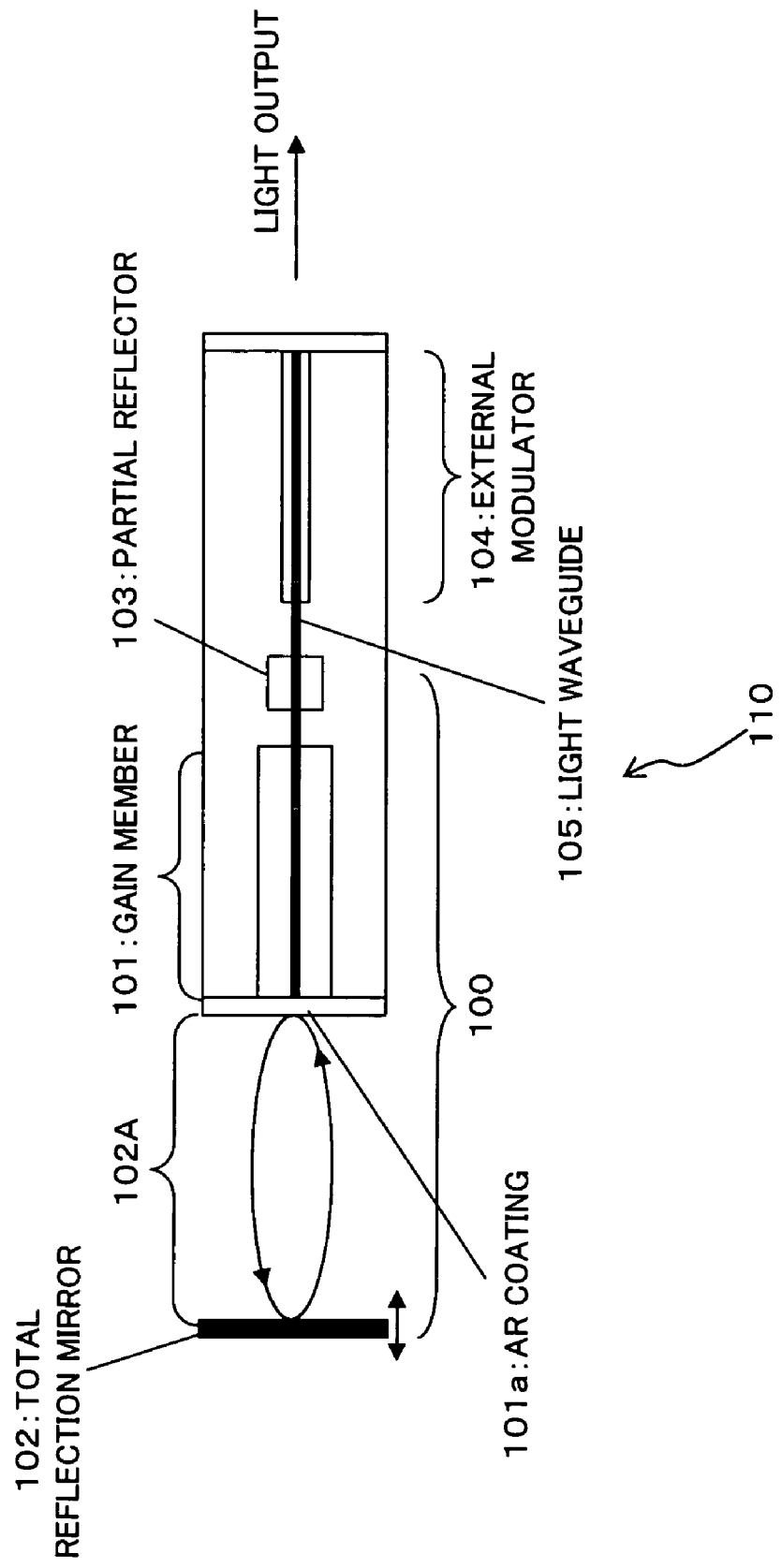

As in the case of the optical module shown in FIG. 11, the gain member 1 and the partial reflection section 2, both of which constitute the laser oscillation section 11, are formed integrally with the external modulator 3 in the optical module 10 shown in FIG. 1. However, the partial reflection section 2 differs in configuration from its counterpart in FIG. 11 and is constituted of the optically-coupling waveguide section 2A and the total reflection mirror 2B. Thereby, the laser oscillating action of the laser oscillation section 11 is rendered more stable than in the case described in Patent Document 1.

Specifically, the optically-coupling waveguide section 2A constituting the partial reflection section 2 is formed from two waveguides (a first light waveguide and a second light waveguide) 2*a*, 2*b* which differ from each other in terms of an optical axis of propagating light and which are directionally coupled together. The first light waveguide 2*a* is optically coupled to the active layer 1*b* of the gain member 1. The total reflection mirror (the first total reflection mirror) 2B is formed along the end face of the substrate at the end of the first light waveguide opposite the gain member 1.

Further, the second light waveguide 2*b* is optically coupled with a light waveguide 3*b* constituting the external modulator 3, and can be formed integrally with the light waveguide 3*b* constituting the external modulator 3. Specifically, during the course of manufacture of the gain member 1, the partial reflection section 2, and the external modulator 3, all of which are provided integrally on the substrate, the first light waveguide 2*a* can be fabricated during the course of manufacture of the active layer 1*b* of the gain member 1, and the second light waveguide 2*b* can be fabricated during the course of manufacture of the light waveguide 3*b* constituting the external modulator 3. Accordingly, processes can be shared in the stage of manufacture of the gain member 1, the partial reflection section 2, and the external modulator 3.

The optical assembly 5 has a configuration of an upper portion and a lower portion being stacked so as to constitute two levels in the propagating direction of light. In this case, the active layer 1*b* of the gain member 1 and the first light waveguide 2*a* of the optically-coupling waveguide section 2A are stacked in the upper level, and the second light waveguide 2*b* of the optically-coupling waveguide section 2A and the light waveguide 3*b* constituting the external modulator 3 are stacked in the lower level. Each of the light waveguides 2*a*, 2*b*, and 3*b* is surrounded by a cladding layer having a comparatively low refractive index. FIG. 1 illustrates a positional relationship between the active layer 1*b* and the light waveguides 2*a*, 2*b*, and 3*b* with special emphasis on this relationship.

Moreover, in the optically-coupling waveguide section 2A, the light directionally coupled to the second light waveguide 2*b* of the light propagating from the gain member 1 through the first light waveguide 2*a* is output to the external modulator 3 as the light having been output from the laser oscillation section 11. In the meantime, light components which have not been directionally coupled to the second light waveguide 2*b* are totally reflected in a direction opposite the total reflection mirror 2B (toward the gain member 1).

Thus, the optically-coupling waveguide section 2A outputs, as the light having been output from the laser oscillation section 11, the light which originates from the gain member 1 and is directionally coupled to the light waveguide 2*b* to the external modulator 3 in predetermined component proportions. Remaining light components, which are directionally coupled to the light waveguide 2*a*, can be totally reflected by the total reflection mirror 2B for effecting laser oscillation. Specifically, the partial reflection section 2 for partially reflecting the light from the gain member 1 is constituted of the above-described optically-coupling waveguide section 2A and the first total reflection mirror 2B.

The first light waveguide 2*a* formed at a level higher than the level—at which the above second light waveguide 2*b* and the light waveguide 3*b* are stacked—is terminated at a position before the area where the external modulator 3 is integrally formed. Side faces of the substrate main body including the cladding layers provided around the first light waveguide 2*a* are formed at a position before the area where the external modulator 3 is formed. Thus, formation of the total reflection mirror 2B that totally reflects the light output from the first light waveguide 2*a* is facilitated, and an area located above the light waveguide 3*b* is exposed, and hence processes of forming the electrode 3*a* are facilitated.

Further, the directional coupling characteristic of the waveguide, such as the optically-coupling waveguide section 2A, is comparatively lower than the directional coupling characteristic of another multiplexing device in terms of wavelength dependence. Consequently, the partial reflection section 2 can acquire a stable partial reflection characteristic without depending on the wavelength of the light oscillating in the laser oscillation section 11. Hence, the resonance characteristic of the optical module can be stabilized.

Figure 2:
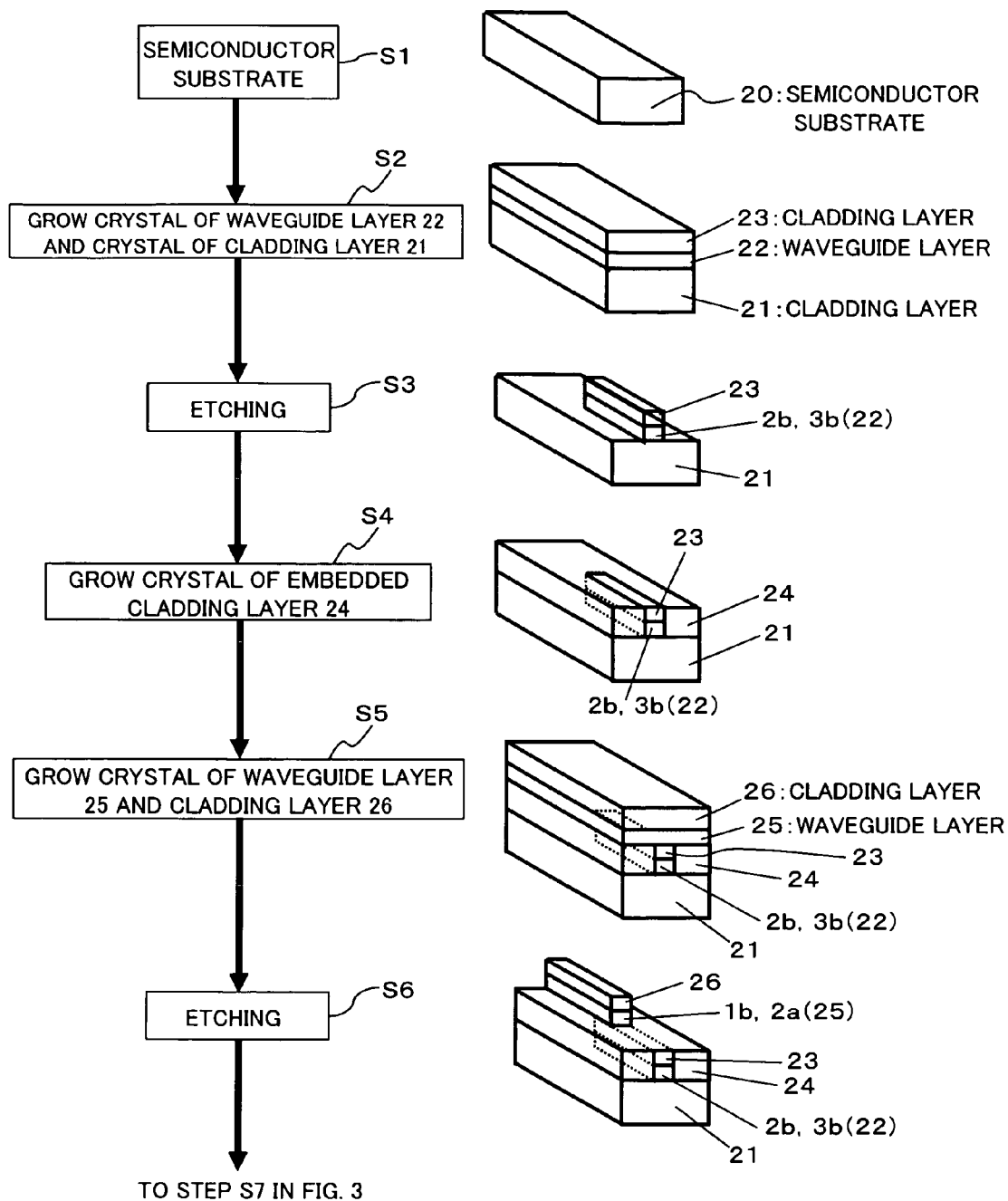
FIGS. 2 and 3 are views for describing processes for manufacturing the optical module of the first embodiment of the present invention.
Figure 3:
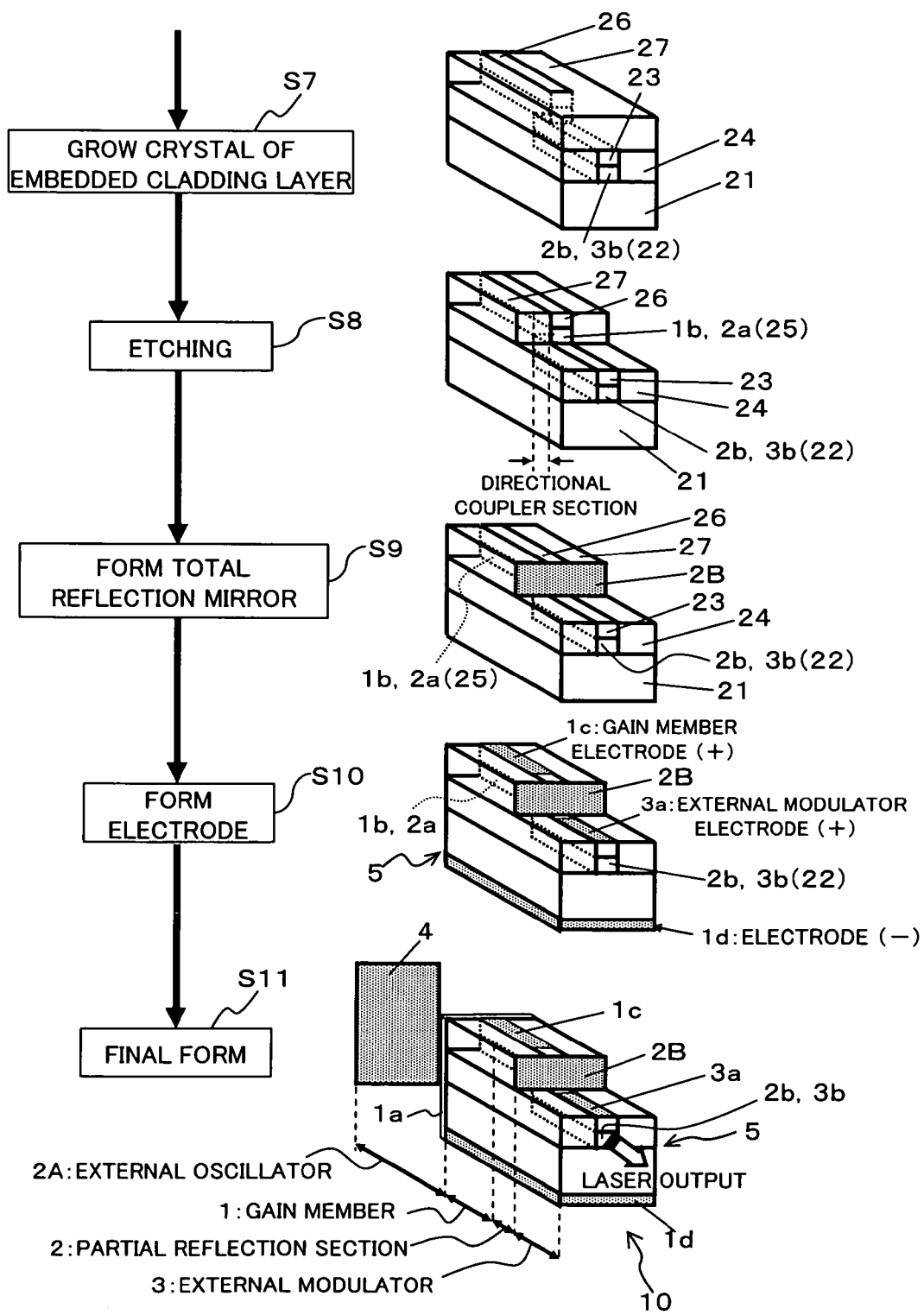

FIGS. 2 and 3 are views for describing processes of manufacturing the optical module 10 shown in FIG. 1. At the time of fabrication of the optical module 10, the optical sub-assembly 5 is first manufactured (steps S1 to S6 in FIG. 2, and steps S7 to S10 in FIG. 3). The thus-manufactured optical sub-assembly 5 is provided with the total reflection mirror 4 that can move back and forth, thereby completing the optical module 10.

At the time of manufacture of the optical sub-assembly 5, a semiconductor substrate 20 is first prepared (step S1). A waveguide layer 22, which is used for forming cladding layers 21, 23, the second light waveguide 2b, and the light waveguide 3a, is stacked on the semiconductor substrate 20 through crystal growth so as to be sandwiched between the two cladding layers 21, 23 (step S2). The semiconductor substrate 20 can be formed as the cladding layer 21 or a portion thereof.

Processing for leaving the pattern of the second light waveguide 2b forming the optically-coupling waveguide section 2A and leaving the pattern of the light waveguide 3b forming the external modulator 3 is performed by means of etching (step S3). An embedded cladding layer 24 is formed by means of crystal growth (step S4). Thereby, the patterns of the second light waveguide 2b and the light waveguide 3b are enclosed by the cladding layers 21, 23, and 24.

The cladding layer 23 or the embedded cladding layer 24 defines an interval between the second light waveguide 2b for which the pattern is formed in step S4 and the first light waveguide 2a to be directionally coupled with the second light waveguide 2b. Accordingly, the thickness of the cladding layer 23 or that of the embedded cladding layer 24 is controlled, as appropriate, such that a desired, predetermined directional coupling characteristic can be achieved in the interval between the waveguides 2a, 2b.

Subsequently, the first light waveguide 2a forming the optically-coupling waveguide section 2A and a waveguide layer 25 for the active layer 1b of the gain member 1 are stacked on the cladding layers 23, 24 formed in step S4, and a cladding layer 26 is further stacked on the cladding layers 23, 24 by means of crystal growth (step S5).

Processing for leaving only the pattern of the first light waveguide 2a forming the optically-coupling waveguide section 2A and the pattern of the active layer 1b forming the gain member 1 is performed by means of etching (step S6). An embedded cladding layer 27 is formed by means of crystal growth (step S7 in FIG. 3). The pattern of the active layer 1b of the gain member 1 and that of the first light waveguide 2a are enclosed with the cladding layers 21, 23, and 24.

Since the embedded cladding layer 27 formed in step S7 is formed over the entire surface of the semiconductor substrate 20, a side face used for forming the total reflection mirror 2B and a device face used for forming the electrode 3a forming the external modulator 3 are formed by means of etching through subsequent processing (step S8). Thereby, the total reflection mirror 2B is formed on the end face of the first light waveguide 2a and the end face of the cladding layer 27, which have been formed in step S8 (step S9).

A gain member electrode (anode) 1c is formed in the area-on the surface where the cladding layer 26 is stacked-where the gain member 1 is to be formed, and the electrode 3a forming the external modulator 3 is formed. Further, another electrode (cathode) 1d is formed over the entire bottom surface of the substrate 20, to thus complete the optical sub-assembly 5 (step S10). The thus-fabricated optical sub-assembly 5 is additionally provided with the total reflection mirror 4 that can be moved back and forth, thereby completing the optical module 10 (step S11).

In FIGS. 2 and 3, the active layer 1b, the first and second light waveguides 2a, 2b, and the light waveguide 3b are formed along axes, which are different from each other, in a vertical direction and along a common axis in the planar direction.

In addition, the active layers and the light waveguides can also be formed along different axes in the planar direction but along a common axis in the vertical direction. By means of this configuration, the active layer 1a, the first and second light waveguides 2a, 2b, and the light waveguide 3b can be formed at the same stack level. Hence, the processes of forming the active layer 1a, the first and second light waveguides 2a, 2b, and the light waveguide 3b can be shared further.

In the optical module 10 of the first embodiment of the present invention having the above configuration, positive feedback passing through the gain member 1 interposed between the total reflection mirror 4 and the total reflection mirror 2B forming the partial reflection section 2 can be implemented. The laser oscillation section 11 can oscillate laser light.

At this time, of the light guided from the gain member 1 to the first light waveguide 2a by means of laser oscillation, the light having passed through the total reflection mirror 2B is reflected. The light guided to the directionally-coupled second light waveguide 2b is output to the external modulator 3 by way of the light waveguide 3b. Accordingly, only a portion of light can be caused to pass, and remaining light components can be reflected. Thereby, the laser oscillation section 11 oscillates light whose wavelength is set according to the arrangement of the total reflection mirror 4, and the thus-oscillated light can be supplied to the external modulator.

At this time, the partial reflection section 2 shown in FIG. 1 uses the total reflection mirror 2B in order to implement the reflection function, and the optically-coupled waveguide section 2A in order to implement the separation function. A partial reflection function, which enables achievement of a stable resonance characteristic as a whole, can be integrated and realized on a single substrate 20 along with the gain member 1 and the external modulator 3.

The partial reflection section 2 of the first embodiment is superior in the following points: namely, the ability to hinder occurrence of multiple reflection, which would otherwise be caused by a partial reflector of etching facet type of the related art; the ability to miniaturize the device to a size smaller than in the case of the partial reflector formed from a waveguide loop mirror; and the ability to effect partial reflection over a wide range because the optically-coupled waveguide section 2A has a very low wavelength dependence characteristic. Therefore, there can be realized an attempt to broaden an oscillation wavelength and enhance stability of the output laser beam by means of only adjusting a wide variable range; i.e., the resonance length of the external resonator 11A.

When compared with a case where a module is provided with the partial reflector consisting of the waveguide loop mirror as in the case of a related-art partial reflector, there can also be realized an attempt to broaden an oscillation wavelength and enhance stability of an output laser beam while miniaturizing the module.

As mentioned above, the optical module 10 according to the first embodiment of the present invention yields an advantage of the ability to broaden an oscillation wavelength and enhance stability of an output laser beam while miniaturizing the module, because the partial reflection section 2 is formed from the optically-coupled waveguide section 2A and the first total reflection mirror 2B.

[A2] Description of a First Modification of the First Embodiment

Figure 4:
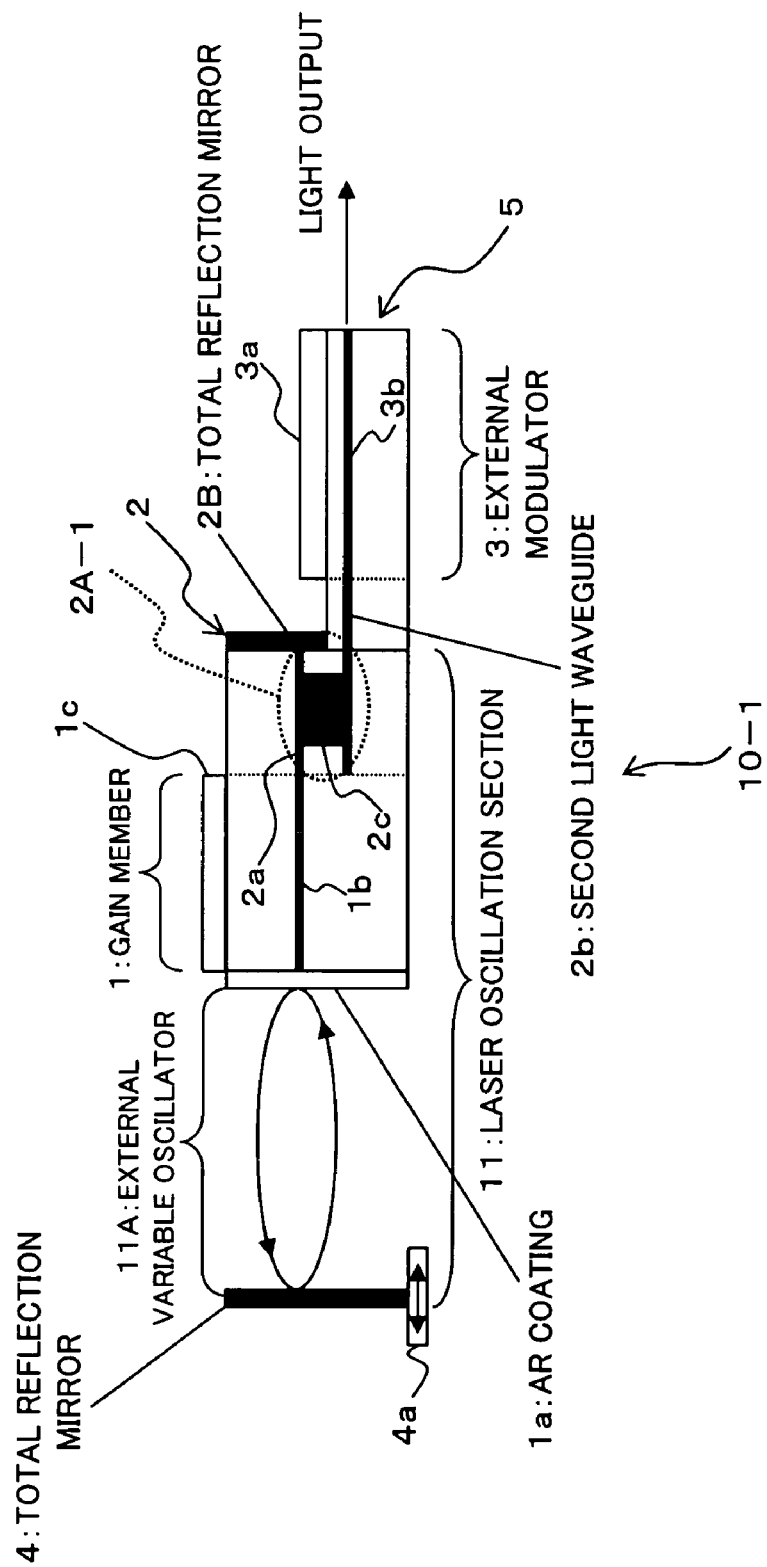
FIG. 4 is a diagrammatic illustration showing an optical module according to a first modification of the first embodiment of the present invention.

FIG. 4 is a diagrammatic illustration showing an optical module 10-1 according to a first modification of the first embodiment of the present invention. The optical module 10-1 shown in FIG. 4 has an optically-coupled waveguide section 2A-1 which differs in configuration from that of the first embodiment. In FIG. 4, those elements corresponding to the elements in the configuration shown in FIG. 1 are assigned the same reference numerals.

The optically-coupled waveguide section 2A-1 has the first light waveguide 2a connected to the gain member 1, and a second light waveguide 2b which has an optical axis differing from that of the first light waveguide 2a and which is optically coupled with the first light waveguide 2a and optically connected to the optical device section 3. Further, the optically-coupled waveguide section 2A-1 has a waveguide 2c of multimode interference (MMI: MultiMode Interferometer) type for connecting the first light waveguide to the second light waveguide. Put another way, the first and second light waveguides 2a, 2b are optically coupled together by means of the waveguide 2c of multimode interference type.

Even in the thus-configured optical module 10-1, in the optically-coupled waveguide section 2A-1 having the waveguide 2c of multimode interference type, the total reflection mirror 2B is formed at an end of the first light waveguide 2a of the two waveguides (the first and second light waveguides) 2a, 2b provided at the end opposite the gain member 1. The remaining second light waveguide 2b is connected to the external modulator 3, thereby implementing a partial reflection function as a whole.

[A3] Description of Second Modification of the First Embodiment

Figure 5:
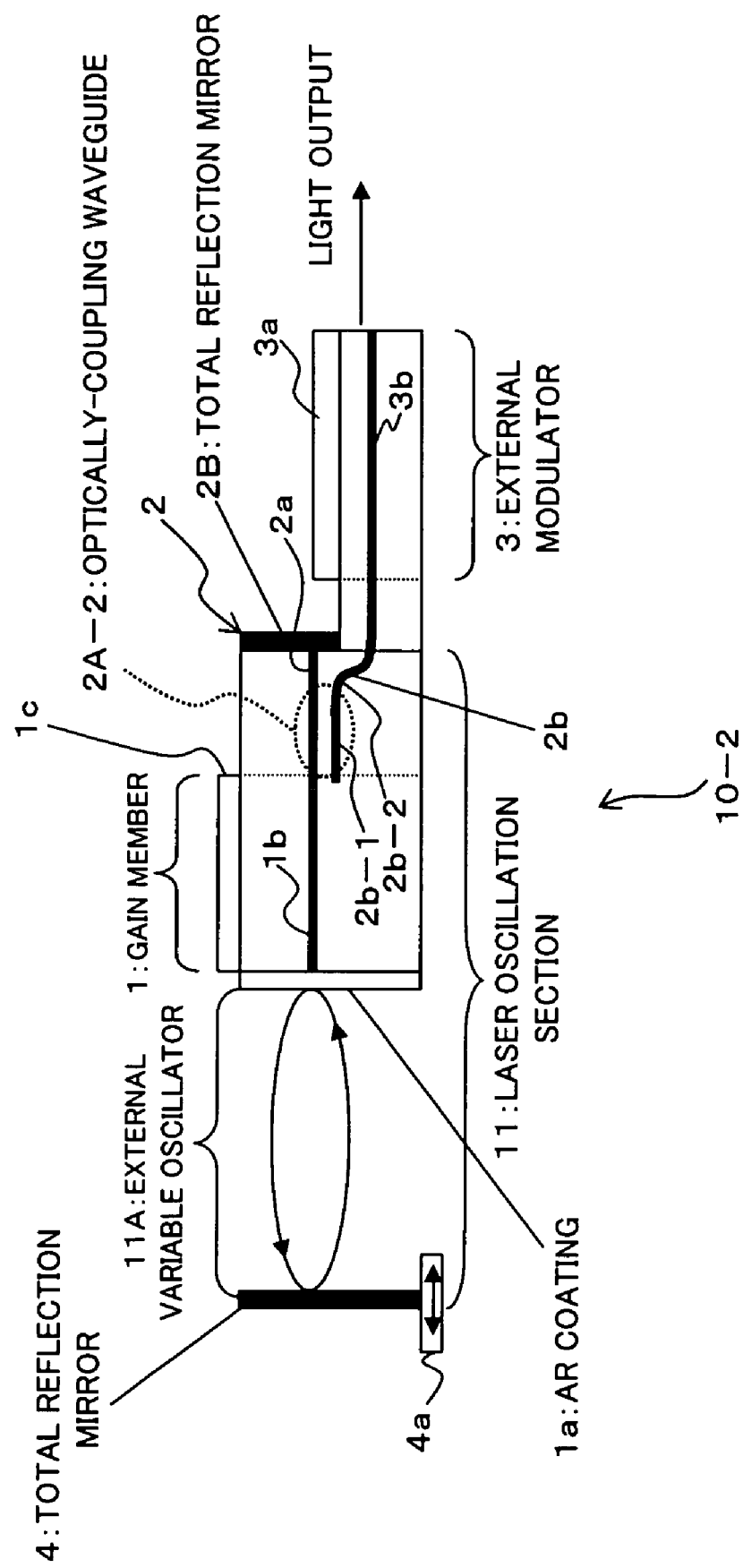
FIG. 5 is a diagrammatic illustration showing an optical module according to a second modification of the first embodiment of the present invention.

FIG. 5 is a diagrammatic illustration showing an optical module 10-2 according to a second modification of the first embodiment of the present invention. The optical module 10-2 shown in FIG. 5 has an optically-coupled waveguide section 2A-2 which differs in configuration from that of the first embodiment. In FIG. 5, those elements corresponding to the elements in the configuration shown in FIG. 1 are assigned the same reference numerals.

The optically-coupled waveguide section 2A-2 is formed as a directionally-coupled waveguide section where the first light waveguide 2a and the second light waveguide 2b are directionally coupled together, as in the case of the first embodiment. However, the optically-coupled waveguide section 2A-2 differs from the optically-coupled waveguide section 2A in that the second light waveguide 2b includes a curved light waveguide section 2b-2. Specifically, the second light waveguide 2b has a waveguide section 2b-1 directionally coupled to the first light waveguide 2a and the curved light waveguide section 2b-2, which is connected to the waveguide section 2b-1, is vertically curved, and is connected to the light waveguide 3b forming the external modulator 3. Even in the case where the optical module is constituted as above, the same working-effect as that yielded in the first embodiment can be obtained.

By means of this curved light waveguide section 2b-2, forming a cladding layer of a width—which sufficiently diminishes the amount of the light that propagates through the light waveguide 3b and is absorbed by the electrode 3a—between the light waveguide 3b and the electrode 3a, both of which constitute the external modulator 3, can be facilitated.

[A4] Description of a Third Modification of the First Embodiment

Figure 6:
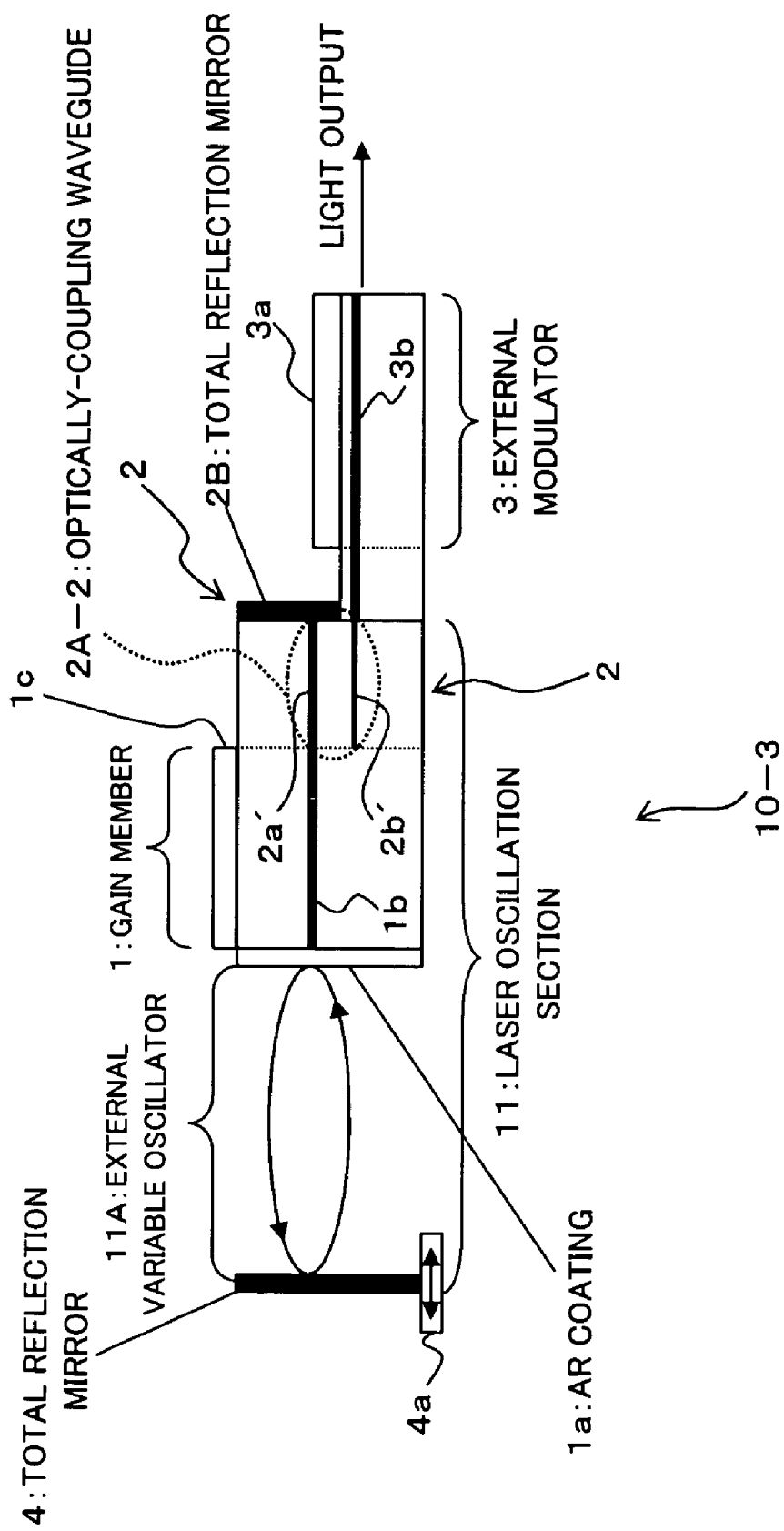
FIG. 6 is a diagrammatic illustration showing an optical module according to a third modification of the first embodiment of the present invention.

FIG. 6 is a diagrammatic illustration showing an optical module 10-3 according to a third modification of the first embodiment of the present invention. The optical module 10-3 shown in FIG. 6 has an optically-coupled waveguide section 2A-3 which differs in configuration from that of the first embodiment. In FIG. 6, those elements corresponding to the elements in the configuration shown in FIG. 1 are assigned the same reference numerals.

The optically-coupled waveguide section 2A-3 is formed as a directionally-coupled waveguide section where a first light waveguide 2a' and a second light waveguide 2b' are directionally coupled together, as in the case of the first embodiment. In the optically-coupled waveguide section 2A-3, the first and second light waveguides 2a', 2b' are formed asymmetrical with each other in terms of waveguide diameter. Even when the optical module is configured as above, the same working-effect as that yielded in the first embodiment can be obtained.

By means of the first and second light waveguides 2a', 2b' whose diameters are asymmetrical with each other, the quantity of light output toward the external modulator 3 and the quantity of light reflected by the total reflection mirror 2B can be adjusted.

[A5] Description of Fourth Modification of the First Embodiment

Figure 7:
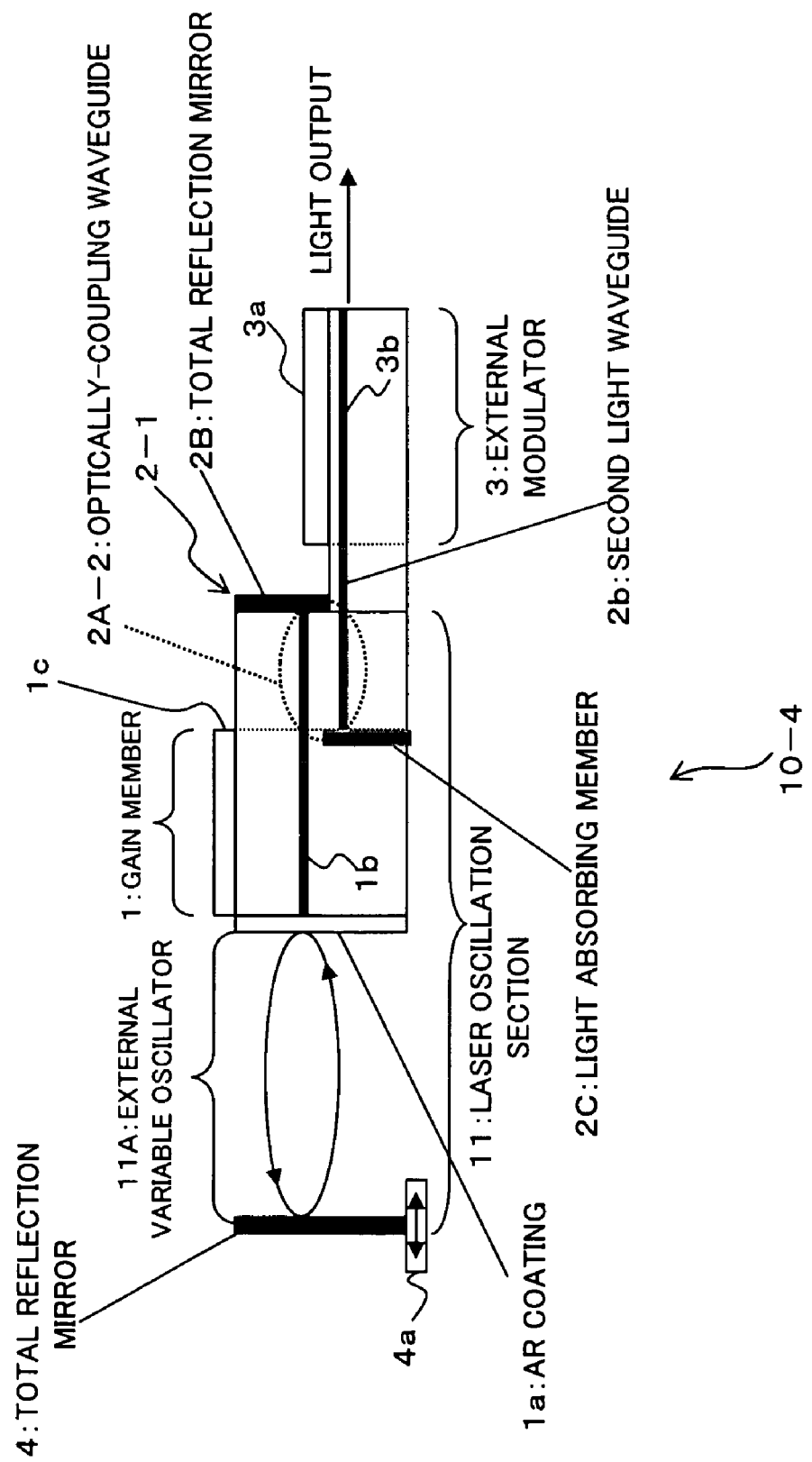
FIG. 7 is a diagrammatic illustration showing an optical module according to a fourth modification of the first embodiment of the present invention.

FIG. 7 is a diagrammatic illustration showing an optical module 10-4 according to a fourth modification of the first embodiment of the present invention. The optical module 10-4 shown in FIG. 7 has a partial reflection section 2-1 which differs in configuration from that of the first embodiment. In FIG. 7, those elements corresponding to the elements in the configuration shown in FIG. 1 are assigned the same reference numerals.

As in the case of the first embodiment, the partial reflection section 2-1 has the optically-coupled waveguide section 2A where the first light waveguide 2a and the second light waveguide 2b are directionally coupled to thus form a directionally-coupled waveguide section; and the total reflection mirror 2B. Moreover, the present modification differs from the first embodiment in that a light absorbing member 2C which absorbs the light having propagated through the second light waveguide 2b toward the gain member 1 is formed at an end of the second light waveguide 2b facing the gain member 1. Even when the optical module is configured as above, the same working-effect as that yielded in the first embodiment can be obtained.

The light absorbing member 2C can prevent leakage of the light coupled to the second light waveguide 2b from the end thereof facing the gain member 1. Hence, when compared in the case of the first embodiment, oscillation of the optical module can be stabilized further. In order to prevent leakage of light to the gain member 1, a mirror can also be used in addition to use of the above-described light absorbing member 2C.

[A6] Description of a Fifth Modification of the First Embodiment

Figure 8:
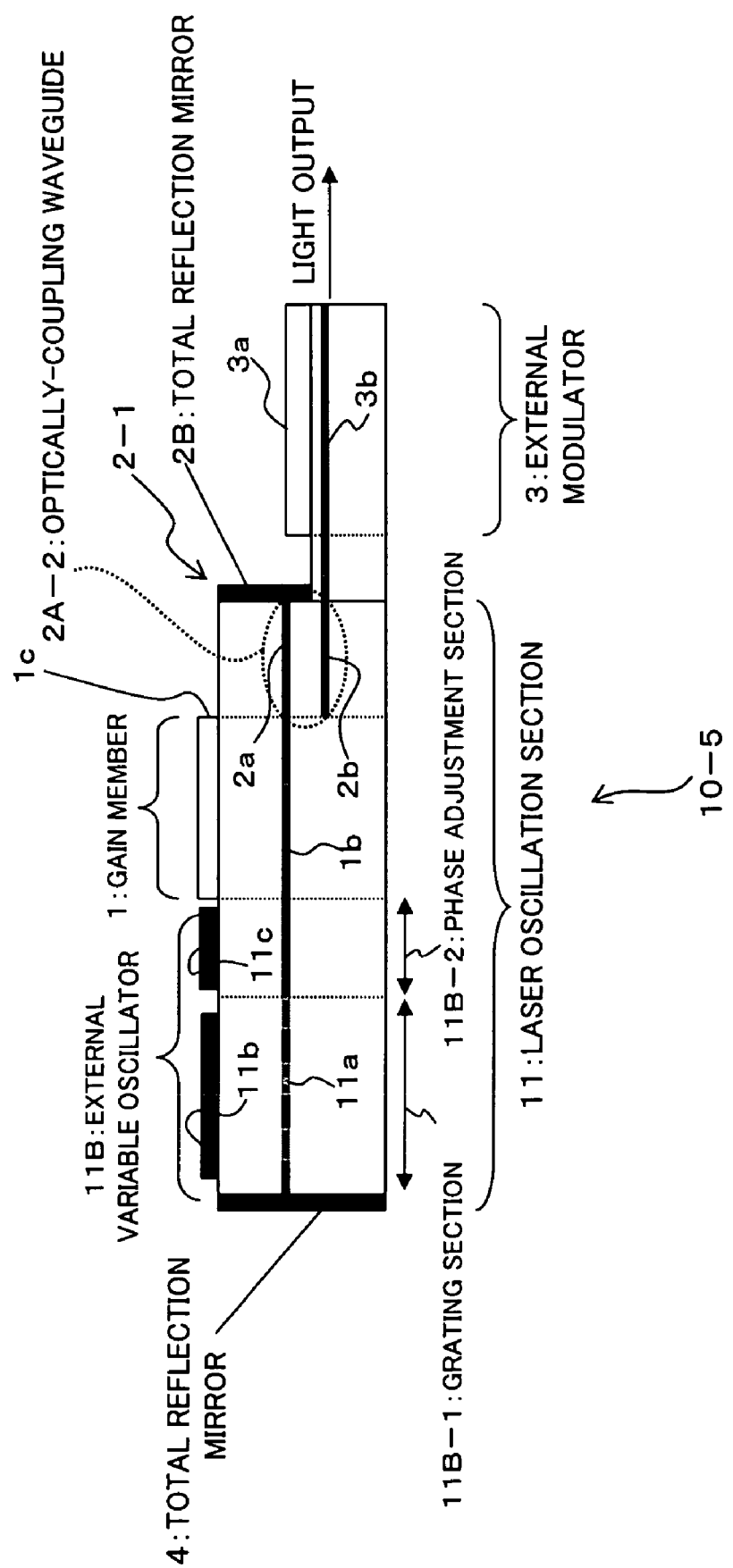
FIG. 8 is a diagrammatic illustration showing an optical module according to a fifth modification of the first embodiment of the present invention.

FIG. 8 is a diagrammatic illustration showing an optical module 10-5 according to a fifth modification of the first embodiment of the present invention. The optical module 10-5 shown in FIG. 8 has an external variable resonator 11B whose configuration differs from that of the first embodiment. In FIG. 8, those elements corresponding to the elements in the configuration shown in FIG. 1 are assigned the same reference numerals.

The external resonator 11B of the optical module 10-5 shown in FIG. 8 is formed by means of a grating section 11B-1 and a phase adjustment section 11B-2, which implement a function for setting an oscillation wavelength through use of the electro-optical effect, being formed integrally on a single substrate between the gain member 1 and the total reflection mirror 4.

Specifically, the total reflection mirror 4 is formed at the end face of the optical module 10-5 opposite the face where the total reflection mirror 2B constituting the partial reflection section 2 is formed. Further, the grating section 11B-1 and the phase adjustment section 11B-2 are formed, in this sequence from the total reflection mirror 4, on the single substrate integrally with the gain member 1, the partial reflection section 2, and the external modulator 3.

In short, a shared light waveguide 11a in the grating section 11B-1 and the phase adjustment section 11B-2 is formed integrally with an active layer 1b in the gain member 1. Further, the grating section 11B-1 has a control electrode 11b used for selecting an oscillation wavelength by means of an applied voltage. The phase adjustment section 11B-2 has a control electrode 11c used for adjusting the phase of light to be oscillated by means of an applied voltage.

Consequently, the grating section 11B-1 and the phase adjustment section 11B-2 constitute an oscillation requirement setting section—which enables variable setting of oscillation requirements for laser oscillation by means of the electro-optical effect—through use of voltages applied to the respective control electrodes 11b, 11c.

Even when the optical module is configured as above, the same working-effect as that yielded in the first embodiment can also be acquired. In the fifth modification, the grating section 11B-1 and the phase adjustment section 11B-2, which serve as the oscillation requirement setting section, and the second total reflection mirror 4 can be configured integrally with the gain member 1, the partial reflection section 2, and the external modulator 3. Accordingly, the optical module can be implemented as the optical module 10-5 in which further integration and further reduction in the size of the device have been pursued.

[A7] Others

The configurations shown in FIGS. 5 to 8 can be applied, as appropriate, to the optical module 10-1 shown in FIG. 4. In addition, the configurations shown in FIGS. 5 to 8 can be applied in combination, as appropriate, to the optical modules 10, 10-1 shown in FIG. 1 or 4. In the modification shown in FIG. 8, the oscillation requirement setting section sets oscillation requirements by means of the electro-optical effect, to thus set an oscillation wavelength. However, according to the present invention, the oscillation requirements may be set by means of, e.g., a thermooptic effect or the like. In addition, the configuration of a known external modulator can be adopted when necessary.

[B] Description of a Second Embodiment

Figure 9:
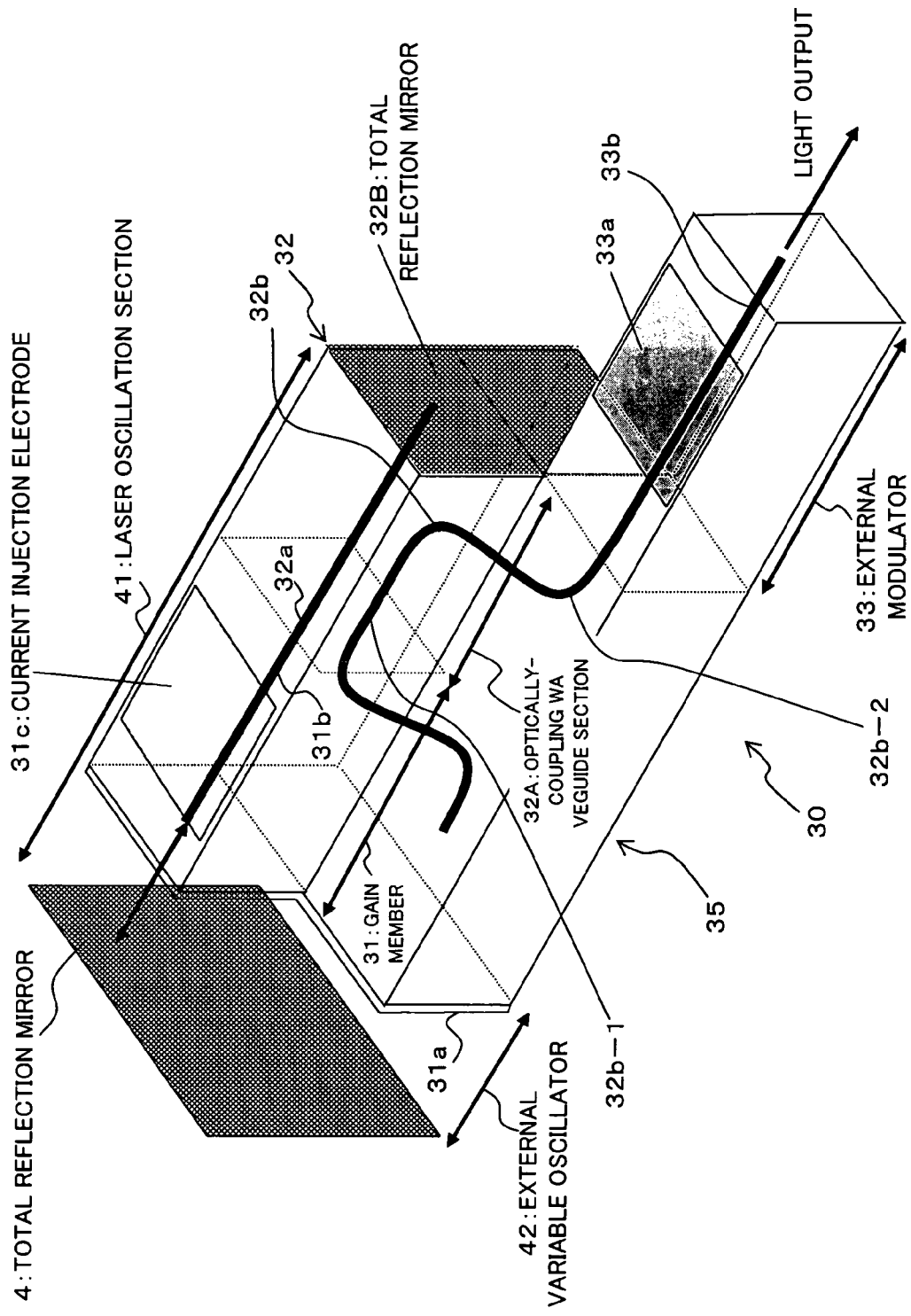
FIG. 9 is a diagrammatic illustration showing an optical module according to a second embodiment of the present invention.
Figure 10:
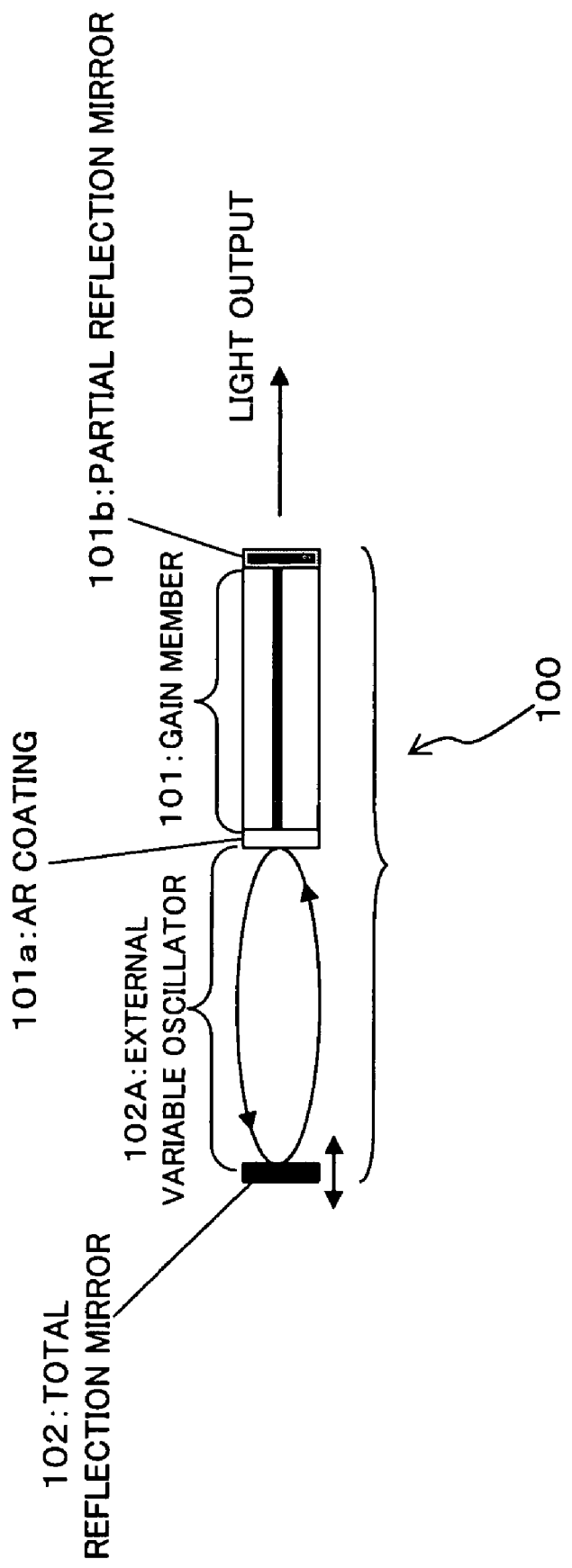
FIGS. 10 and 11 are views showing related-art techniques.

FIG. 9 is a diagrammatic illustration showing an optical module 30 according to a second embodiment of the present invention. The optical module 30 shown in FIG. 9 has an optical sub-assembly 35 which is identical with its counterpart in the first embodiment in terms of function but differs from the same in terms of configuration. The optical module has the total reflection mirror (the second total reflection mirror) 4 analogous to that employed in the first embodiment.

The optical sub-assembly 35 of the second embodiment assumes a shape, into which an upper-level portion is stacked on a lower-level portion, such that a two-stage stepwise configuration is achieved in a direction perpendicular to the direction of the section through which the laserbeam is oscillated. The lower-level portion has a configuration such that an area where an external modulator 33 is to be formed extends. Specifically, a gain member 31 having the two-staged stepwise shape, an optically-coupled waveguide section 32A having a stepwise shape analogous to that of the gain member 31, the external modulator 33, and a total reflection mirror 32B are formed integrally into the optical sub-assembly 35. The total reflection mirror 32B constitutes the partial reflection section 32 along with the optically-coupled waveguide 32A.

The gain member 31 has a current injection electrode 31c and an active layer 31b; the optically-coupled waveguide 32A has first and second light waveguides 32a, 32b which are to be directionally coupled; and the external modulator 33 has an electrode 33a and a light waveguide 33b. The active layer 31b and the light waveguides 32a, 32b, and 33b are enclosed with cladding having a comparatively-low refractivity. The exterior shape of the above stepwise shape can be defined by the cladding. Reference numeral 31a designates an antireflective film formed on the side surface of the optical sub-assembly 35 facing the gain member 31.

Thus, a laser oscillation section 41, which oscillates laser, is constituted of the gain member 31, the partial reflection section 32, and the total reflection mirror 4. A section of the optical path between the total reflection mirror 4 and the antireflective film 31a serves as an external variable resonator 42 capable of variably imparting resonance requirements.

As in the case of the first embodiment, the active layer 31b of the gain member 31 and the first light waveguide 32a of the optically-coupled waveguide section 32A, which is continuous with the active layer 31b, are stacked in the upper-level section. Meanwhile, the second light waveguide 32b directionally coupled to the first light waveguide 32a, and the light waveguide 33b (forming the external modulator 33) continuous with the second light waveguide 32b are stacked in the lower-level section. However, the second light waveguide section 32b of the optical sub-assembly 35 has a configuration differing from that of the second light waveguide 32b employed in the first embodiment.

The second light waveguide 32b of the second embodiment has a waveguide section 32b-1 directionally coupled to the first light waveguide 32a; and a curved light waveguide section 32b-2 which is connected to the waveguide section 32b-1, is curved in the planar direction of the substrate, and is connected to an optical waveguide 33b which constitutes the external modulator 33.

By means of this curved light waveguide section 32b-2, the axis in the planar direction of the first light waveguide 32a and the active layer 31b, in which the laser beam oscillates, and the axis in the planar direction of the light waveguide 33b of the external modulator 33 can be shifted. As a result, forming the total reflection mirror 32B can be facilitated. Further, it becomes easy to form the light waveguide 33b which lessens the amount of light absorbed by the electrode 33a forming the external modulator 33 while ensuring an interval between the light waveguide 33b and the electrode 33a.

Even in the optical module 30 of the second embodiment configured as mentioned above, positive feedback passing through the gain member 31 interposed between the total reflection mirror 4 and the total reflection mirror 32B serving as the partial reflection section 32 can be implemented. The laser oscillation section 41 can oscillate laser light.

In this case, of the light guided from the gain member 31 to the first light waveguide 32a by means of laser oscillation, the light traveling toward the total reflection mirror 32B is reflected, whilst the light guided to the directionally-coupled second light waveguide 32b is output to the external modulator 33 by way of the light waveguide 33b. Hence, only a portion of the light components is allowed to pass, and the remaining light components can be reflected. Thus, the laser oscillation section 41 oscillates the light whose wavelength is set in accordance with the arrangement of the total reflection mirror 4, and can supply the external oscillator 33 with the thus-oscillated light.

As mentioned above, even in the second embodiment of the present invention, the advantage analogous to that achieved in the first embodiment can be acquired. In addition, the axis in the planar direction of the first light waveguide 32a and the active layer 31b, in which the laser beam oscillates, and the axis in the planar direction of the light waveguide 33b in the external modulator 33 can be shifted by means of the curved light waveguide section 32b-2. Hence, there is yielded an advantage of the ability to readily form the light waveguide 33b that can diminish the amount of light absorbed by the electrode 33a and to facilitate the formation of the total reflection mirror 32B.

[C] Others

Not withstanding the disclosure of the respective embodiments, the present invention can be practiced while being modified in various manners within the scope of the present invention.

For example, the external modulators 3, 33 of the first and second embodiments may be formed from an optical device having another function. Specifically, the external modulator may be configured as an optical attenuator for use in a case where the attenuator is used as a light source additionally provided with a light intensity adjustment function. Alternatively, the external modulator may be configured as an optical switch for use in a case where the switch is used as a light source additionally provided with a light switching function.

Although omitted from FIGS. 1 and 4 through 9, an electrode analogous to the electrode 1d shown in FIG. 3 can also be formed.

Moreover, by means of disclosure of the above-described embodiment, the device of the present invention can be manufactured.

What is claimed is:

1. An optical module comprising:
   a gain member which outputs light;
   a first mirror which is disposed at an end of a first light waveguide through which light from said gain member propagates;
   a second light waveguide which has an optical axis differing from that of the first light waveguide and is optically coupled to the first light waveguide; and
   an optical device including a part of the second light waveguide, which part projects from a plane forming said first mirror.

2. The optical module according to claim 1, wherein the first light waveguide is directionally coupled to the second light waveguide.

3. The optical module according to claim 1, wherein the optical module further comprises a multimode interference waveguide for connecting together the first light waveguide and the second light waveguide.

4. The optical module according to claim 1, wherein the second light waveguide includes a curved light waveguide section.

5. The optical module according to claim 1, wherein the thicknesses of respective first light waveguide and the second light waveguide are asymmetrical to each other.

6. The optical module according to claim 1, wherein a light absorbing member is formed at an end of the second light waveguide facing the gain member.

7. The optical module according to claim 1, wherein the partial reflection section subjects a portion of light, which has entered the first light waveguide by way of the gain member, to total reflection on the first total reflection mirror, and outputs a remaining portion of the light to the optical device section by way of the second light waveguide.

8. The optical module according to claim 1, wherein the optical device is a light modulator, an optical attenuator, or an optical switch.

9. The optical module according to claim 1, further comprising:
   a second total reflection mirror which is disposed opposite the first mirror by way of the gain member; and
   which constitutes a laser oscillation section for oscillating laser with the cooperation of the first total reflection mirror and the gain member; and
   an oscillation condition setting section which variably sets oscillation conditions for the oscillating laser.

10. The optical module according to claim 9, wherein the oscillation condition setting section is formed from a distance setting mechanism which variably sets a distance between the second total reflection mirror and the gain member.

11. The optical module according to claim 9, wherein the oscillation condition setting section is formed integrally on the gain member.

12. The optical module of claim 1, wherein:
   the first light waveguide is formed in a first crystal layer grown on the semiconductor substrate and the second light waveguide is formed in a second crystal layer grown on the semiconductor substrate.

13. An optical module comprising:
   a gain member which is formed on a semiconductor substrate and outputs light;
   a first mirror which is disposed at an end of a first light waveguide through which light from said gain member propagates;
   a second light waveguide which is formed on the semiconductor substrate and has an optical axis differing from that of the first light waveguide and is optically coupled to the first light waveguide; and
   an optical device including a part of the second light waveguide, which part projects from a plane forming said first mirror.

14. The optical module of claim 13, wherein:
   the first light waveguide is formed in a first crystal layer grown on the semiconductor substrate and the second light waveguide is formed in a second crystal layer grown on the semiconductor substrate.

15. A laser oscillation device comprising a first mirror, a second mirror and a gain member disposed between said first and second mirror to output light which is reflected by said first and second mirror, wherein said laser oscillation device further comprises an optical waveguide which is optically coupled to a light propagation path from said gain member to said second mirror at an arbitrary propagation portion of said light propagation path, said optical waveguide includes a projection portion that projects from a position between said first and second mirrors to the direction of said second mirror; and said laser oscillation device further comprises an optical device which includes the projection portion of said optical waveguide.

* * * * *